(12) United States Patent
Kim

(10) Patent No.: US 7,715,247 B2
(45) Date of Patent: May 11, 2010

(54) ONE-TIME PROGRAMMABLE READ-ONLY MEMORY WITH A TIME-DOMAIN SENSING SCHEME

(76) Inventor: Juhan Kim, 5890 W Walbrook Dr, San Jose, CA (US) 95129

( * ) Notice: Subject to any disclaimer, the term of this patent is extended or adjusted under 35 U.S.C. 154(b) by 98 days.

(21) Appl. No.: 12/205,867

(22) Filed: Sep. 6, 2008

(65) Prior Publication Data
US 2010/0061137 A1    Mar. 11, 2010

(51) Int. Cl.
*G11C 7/22* (2006.01)
(52) U.S. Cl. .................. 365/189.14; 365/189.15; 365/189.16; 365/189.05; 365/194; 365/102; 365/104; 365/103; 365/148; 365/163
(58) Field of Classification Search .......... 365/100, 365/102, 104, 103, 148, 163, 189.14, 189.15, 365/189.16, 189.17, 189.05, 194
See application file for complete search history.

(56) References Cited
U.S. PATENT DOCUMENTS
5,148,063 A    9/1992  Hotta

| 6,504,789 | B2 | 1/2003 | Hirakawa |
| 6,700,151 | B2 | 3/2004 | Peng |
| 7,102,951 | B2 | 9/2006 | Paillet et al. |
| 7,411,810 | B2* | 8/2008 | Kim ........................... 365/145 |
| 7,609,539 | B2* | 10/2009 | Peng et al. ..................... 365/96 |

* cited by examiner

*Primary Examiner*—Andrew Q Tran

(57) ABSTRACT

For realizing high speed one time programmable memory, bit line is multi-divided for reducing capacitance, so that the bit line is quickly charged when reading and multi-stage sense amps are used for connecting divided bit line, wherein the multi-stage sense amps are composed of a first dynamic circuit serving as a local sense amp for reading the memory cell, a second dynamic circuit serving as a segment sense amp for reading the local sense amp, and a tri-state inverter serving as an amplify circuit of a global sense amp for reading the segment sense amp. When reading data, a voltage difference in the bit line is converted to a time difference for differentiating high data (programmed) and low data (unprogrammed) by the multi-stage sense amps. And buffered data path is connected to the global sense amp for realizing fast data transfer. Additionally, alternative circuits and memory cell structures are described.

20 Claims, 7 Drawing Sheets

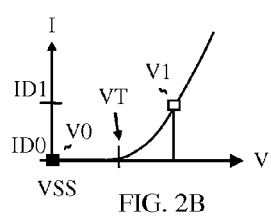
FIG. 2B
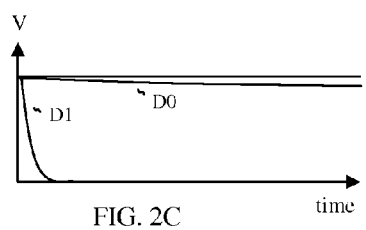
FIG. 2C
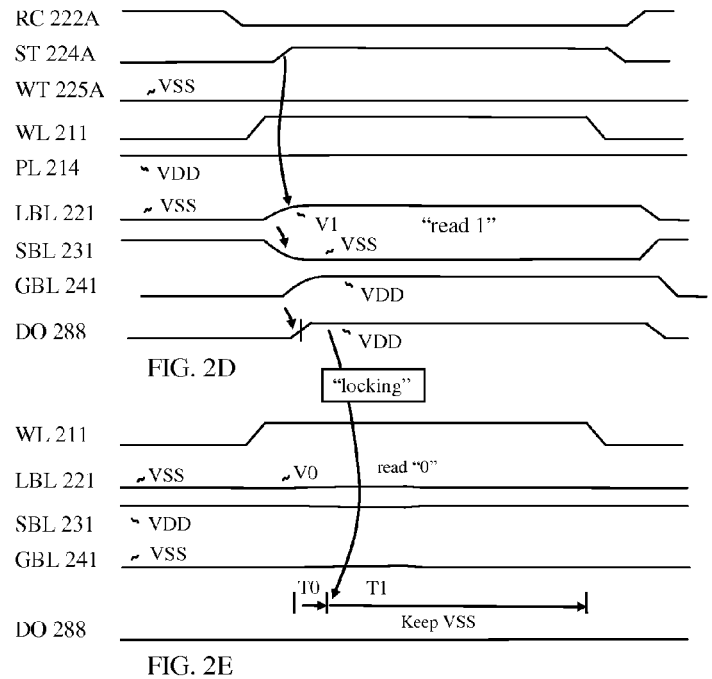
FIG. 2D
FIG. 2E
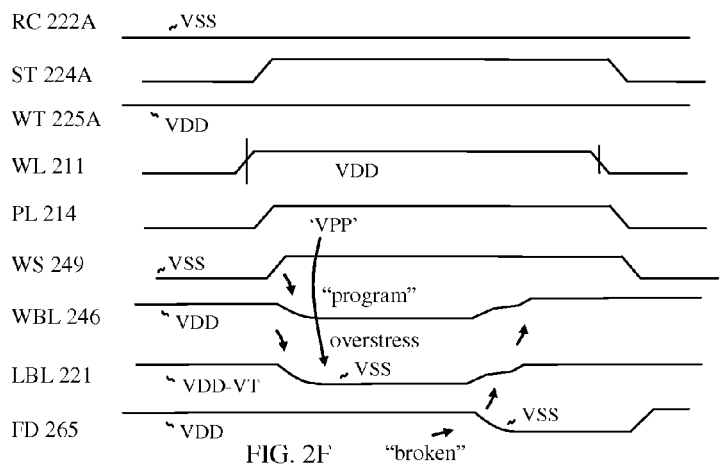
FIG. 2F
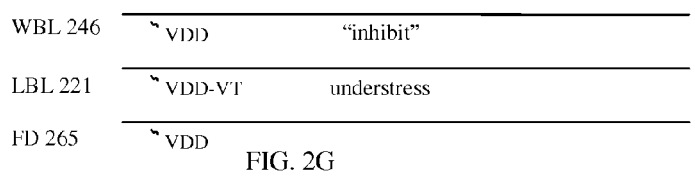
FIG. 2G

FIG. 6A (6F² Cell)

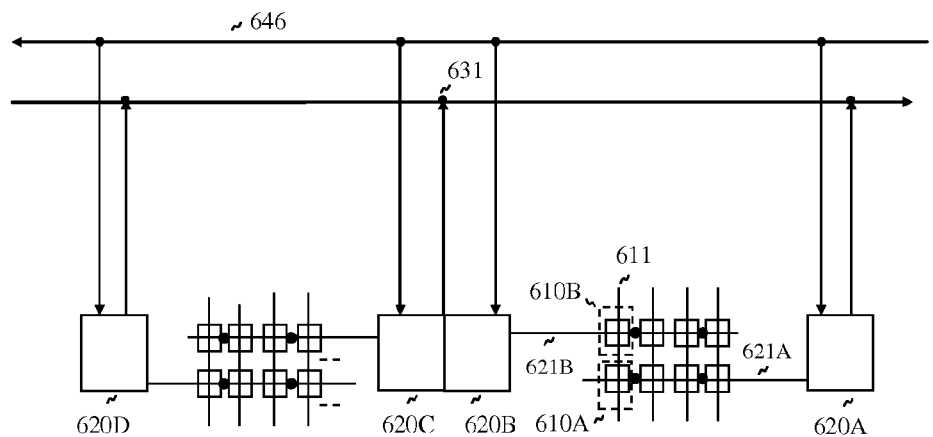
FIG. 6F
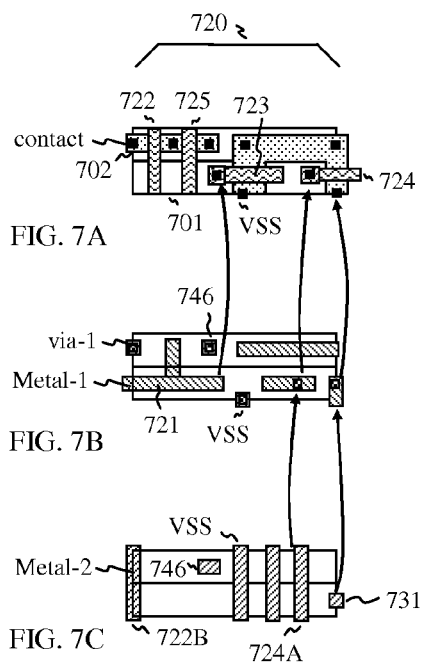
FIG. 7A
FIG. 7B
FIG. 7C
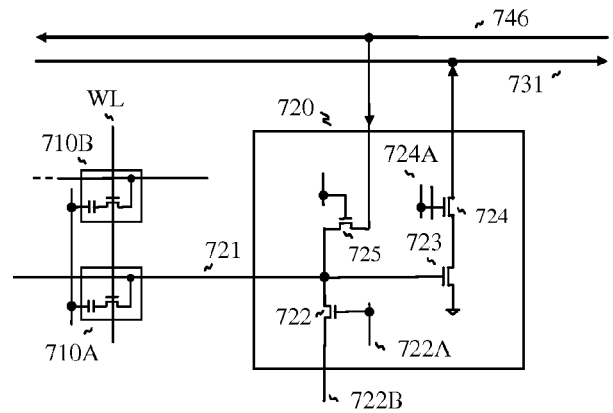
FIG. 7D

ONE-TIME PROGRAMMABLE READ-ONLY MEMORY WITH A TIME-DOMAIN SENSING SCHEME

FIELD OF THE INVENTION

The present invention relates to a semiconductor memory device, and more particularly, to OTP (One-Time Programmable) read only memory.

BACKGROUND OF THE INVENTION

OTP (One-Time Programmable) read only memory is used in integrated circuits for a variety of applications including nonvolatile memory applications. They may be used as a single memory cell, or in arrays of memory cells to provide unique chip identifications and to set operating parameters such as clock multipliers and voltage levels for devices such as microcontrollers and microprocessors, and also high-density memory applications for various applications. They may also be used to configure, customize, and repair a chip after testing, in order to repair a controller's cache memory array. One-time programmable memories are typically implemented using charge storage, fuse, or anti-fuse approaches. Charge storage approaches have typically involved defining a bit value based on charge stored on an insulated metal-oxide semiconductor (MOS) type gate structure. Such charge storage approaches, however, are not practicable with current and deep sub-micron technologies that feature very thin gate oxide because of the high gate leakage current that prevents a long retention time of the information. And other type of OTP memory is capacitor type, wherein oxide breakdown is used to program the capacitor type memory cells, as published, U.S. Pat. No. 7,102,951 and U.S. Pat. No. 6,700,151.

In FIG. 1A, a memory cell 100 comprises an NMOS transistor 102, a high voltage device 104, and a sense circuit 105 (depicted by broken line) formed from a program/sense NMOS transistor 106 and a sense amplifier 108. The MOS memory cell device 102 has two terminals, one coupled to VSENSE/VPROG terminal 112, and the other coupled to the high voltage device 104. The memory cell 100 is used in a MOS logic circuit operating with a VDD (supply) voltage of about 1.2 V. Accordingly, the voltage supply terminal 112 (VSENSE/VPROG) is set at about 1.2 V during sensing (reading) and in excess of about 3 V during programming. The high voltage device 104 is positioned between the memory cell 102 and the sense amplifier 105 to protectively shield it from the high programming voltage. The program/sense transistor 106 is an NMOS transistor with the sense amplifier 108 coupled at its drain.

When programming the memory cell, a PROG/SENSE control signal 116 is input at the gate of the program/sense transistor 106 to turn it on. And when the memory cell is to be sensed, the PROG/SENSE control signal 116 is turned off. During programming when the high VPROG voltage 112 is applied at the voltage supply terminal, both the high voltage device and program/sense transistor 106 are "on" thereby causing the high program voltage to be applied across the memory cell 102, which is initially open. A current path is provided from the memory cell 102 to ground through the high voltage device 104 and program/sense transistor 106. Thus, as the memory cell breaks down, current is tunneled through it until its resistance is sufficiently reduced (i.e., until it is "blown"). During sensing, on the other hand, the lower VDD voltage is applied at the memory cell voltage supply terminal 112, and the program/sense transistor 106 is turned off, which forces current passing through the memory cell (if it has been blown) to flow substantially into the sense amplifier 108.

However, the VSENSE/VPROG terminal 112 as a common electrode is heavily loaded, when the memory array is increased. Hence, the common electrode 112 should flow very high current when the memory array is big, which causes a data pattern sensitivity. For example, maximum current should be flown through the common node, when all the memory cells are programmed to "1" (blown), while no current should be flown when programming all "0" (not blown). This means that the common electrode 112 may be dropped by high current when programming all "1", which may increase programming time to break down the oxide, because programming voltage has been changed with all "1" programming when the memory array is increased. Furthermore, a resistance after blowing may be different depending on data pattern. In order to increase density with OTP memory, pattern sensitivity should be reduced.

And in FIG. 1B, another prior art is illustrated as published, U.S. Pat. No. 5,675,547, wherein memory cells are connected to multiple word lines 153, 173, 174 and 175, and multiple bit lines 154 and 156, and a common plate line 155 is connected to multiple memory cells as well. The OTP (one time programmable) memory circuit 150 includes a sense amp 176 for programming and reading data which is stored in the memory cell including a capacitor 152 as a one-time programmable storage element and a pass transistor 151 as an access device. The capacitor 152 is destroyed or not for storing a data. However, the common plate line may cause data pattern sensitivity when programming all "1" (blown) or all "0" (not blown). Furthermore, the common plate line 155 is raised to high voltage for programming a selected row 153, but other rows 173, 174 and 175 are not selected, such that gate oxide of unselected pass transistors are overstressed after the selected capacitor is destroyed, because unselected word lines 173, 174 and 175 keep low while the common plate line 155 is asserted to high voltage 3V, for instance. Hence, gate oxide of unselected memory cell may be destroyed during programming. In order to avoid overstress, additional biased transistor is added, as published, U.S. Pat. No. 6,927,997, but additional transistor increases cell area. Furthermore, the local bit line 154 is heavily loaded with conventional sensing scheme which includes differential amplifier, so that charging time of the local bit line is slow, which is one of obstacles for achieving fast read operation.

In this respect, there is still a need for improving the read only memory, which realizes fast random access. In the present invention, bit line is multi-divided for reducing parasitic capacitance, so that the bit line is quickly charged when reading and multi-stage sense amps are used for reading the divided bit lines. When programming the OTP memory, in particular, the multi-stage sense amps serve as a detector circuit, such that the detector circuit detects whether the capacitor is blown or not, and generates a feedback signal after the capacitor is blown. Thus, the feedback signal is used to cut off a current path from the capacitor to the bit line. Thereby voltage drop of a plate of the capacitor is reduced during program, which realizes more uniform programming with less voltage drop of the plate.

The memory cell can be formed on the surface of the wafer. And the steps in the process flow should be compatible within the current CMOS manufacturing environment. Alternatively, the memory cell can be formed from thin film polysilicon layer, because the lightly loaded bit line can be quickly discharged by the memory cell even though the thin film pass transistor can flow relatively low current. In doing so, multi-stacked memory is realized with thin film transistor, which can increase the density within the conventional CMOS process with additional process steps, because the conventional CMOS process is reached to a scaling limit for fabricating transistors on a surface of a wafer. In addition, a body-tied TFT (Thin Film Transistor) transistor can be used as the thin film transistor for alleviating self heating problem of short channel TFT.

SUMMARY OF THE INVENTION

For realizing high speed read operation for the OTP memory, bit line is multi-divided, which reduces parasitic capacitance, so that the divided bit line is quickly charged when reading and multi-stage sense amps are used for connecting divided bit line, wherein the multi-stage sense amps are composed of dynamic circuits for realizing fast access and eliminating penetration current when reading. More specifically, the multi-stage sense amps include a first dynamic circuit serving as a local sense amp, a second dynamic circuit serving as a segment sense amp, and a first tri-state inverter serving as an amplify circuit of a global sense amp, while a second tri-state inverter is used for bypassing an output from a previous memory block, which configures a data transfer circuit. The dynamic circuits are also useful to reduce operating voltage for realizing low power consumption, because the dynamic circuits are turned on around threshold voltage of MOS transistor for detecting whether the amplify circuit is turned on or not by a selected memory cell. With multi-stage sense amp, fast read operation is realized because each sense amp drives a lightly loaded and divided bit line, such that the memory cell drives the lightly loaded local bit line, the local sense amp drives a segment bit line for transferring a read output to the segment sense amp, the segment sense amp drives a global bit line for transferring the read output to the global sense amp, and the global sense amp drives a very lightly loaded common node of the data transfer circuit for transferring the read output to an output latch circuit.

And a buffered data path is connected to the global sense amp for writing and reading a data, wherein a forwarding write line serving as a forwarding write path is used for writing, such that the forwarding write path is selected by block select signals, which realizes to reduce driving current and RC time constant, because unselected portion of the data line is not charging or discharging when writing. Furthermore, unselected portion of the data line is used as a returning read path. Thus, the returning read path receives a read output from the memory cell through the multi-stage sense amps. And the returning read path is also buffered and connected to data output node through multiple buffers. With the returning read path, access time is almost same regardless of selected memory cell location, which realizes to latch the read output at a time with enough set-up and hold time even though a latch clock is fixed.

And, amplifying transistors of the sense amps are composed of relatively long channel transistors, in order to reduce turn-off current, which reduces power consumption.

In order to match the width of the local sense amp with pitch of two memory cells, the local sense amps are fit with pitch of two memory cells, so that the local sense amp is connected to multiple memory cells through the local bit line. And the segment sense amps are also fit with pitch of two memory cells. And the global sense amp is shared by eight columns. For configuring high density and high speed memory, small local sense amp is frequently repeated, but the segment sense amp is rarely repeated. And the global sense amp is used only for a memory block or bank. Thereby the sense amp area is relatively negligible portion as long as the memory cells occupy most of the array region.

Furthermore, configuring the memory is more flexible, such that number of sense amps can be determined by the target speed. For example, high speed application needs more segmented array with more sense amps, while high density application needs more memory cells with reduced number of sense amps, thus cell efficiency is increased.

Furthermore, the local sense amp has high gain with wider channel MOS transistor than that of the memory cell, and the segment sense amp has higher gain than that of the local sense amp. For instance, a wider channel MOS transistor can be used as the segment amplify transistor for the segment sense amp, which realizes fast read operation.

By the sense amps, a voltage difference in the local bit line is converted to a time difference as an output of the global sense amp with gain of the sense amps. In this manner, a time-domain sensing scheme is realized to differentiate high data and low data stored in the memory cell. For instance, high data is quickly transferred to an output latch circuit through the sense amps with high gain, but low data is rejected by a locking signal based on high data as a reference signal.

More specifically, a reference signal is generated by one of fast changing data with high gain from reference cells, which signal serves as a reference signal to generate a locking signal or a read duration control signal in order to reject latching another data which is slowly changed with low gain, such that high voltage data is arrived first while low voltage data is arrived later, or low voltage data is arrived first while high voltage data is arrived later depending on configuration. The time domain sensing scheme effectively differentiates high voltage data and low voltage data with time delay control, while the conventional sensing scheme is current-domain or voltage-domain sensing scheme. In the convention memory, the selected memory cell discharges the local bit line, and the discharged voltage of the local bit line is compared by a comparator which determines an output at a time. There are many advantages to realize the time domain sensing scheme, so that the sensing time is easily controlled by a tunable delay circuit, which compensates cell-to-cell variation and wafer-to-wafer variation, such that there is a need for adding a delay time before locking the latch circuit with a statistical data for all the memory cells, such as mean time between fast data and slow data. Thereby the tunable delay circuit generates a delay time for optimum range. And the read output from the memory cell is transferred to the latch circuit through a returning read path, thus the access time is equal regardless of the location of the selected memory cell, which is advantageous to transfer the read output to the external pad at a time.

When programming the memory cell, the multi-stage sense amp serves as a current detector to cut off a current path after blown. In doing so, data pattern sensitivity is reduced when programming. Without the current detector circuit, maximum current flows when programming all "1" (blown) or no current flows when programming all "0" (not blown).

Furthermore, the memory cell can be reduced because the memory cell only drives a lightly loaded local bit line when reading, and also the current flow of the pass transistor can be reduced, which means that the memory cell can be miniaturized further. Moreover, the present invention realizes multi-stacked memory cell structure including thin film transistor because the memory cell only drives lightly loaded bit line even though thin film polysilicon transistor can flow lower current, around 10 times lower, for example.

Furthermore, various alternative configurations are described for implementing the multi-stage sense amps. Furthermore, example memory cell layout and cross sectional views are illustrated to minimize cell area. And the fabrication method is compatible with the conventional CMOS process for realizing planar memory cell including the single-crystal-based regular transistor. And alternatively, additional steps are required for using thin film polysilicon transistor as a pass transistor of the memory cell. And the memory cell can be formed from various semiconductor materials, such as silicon-germanium and germanium.

Furthermore, the capacitor of the memory cell is composed of various structures, such as a MOS (Metal-Oxide Semiconductor) gate capacitor, a PIP (Polysilicon Insulator Polysilicon) capacitor and an MIM (Metal Insulator Metal) capacitor.

Still, furthermore, the multi-stage sense amps are useful for realizing high speed mask ROM as an alternative configuration because the read path is same as the OTP memory except programming method.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings which are incorporated in and form a part of this specification, illustrate embodiments of the invention and together with the description, serve to explain the principles of the invention.

FIG. 2B illustrates an I-V curve of the local sense amp when reading, FIG. 2C illustrates discharge time of a segment bit line, FIG. 2D illustrates a timing diagram for reading data "1", FIG. 2E illustrates a timing diagram for reading data "0", FIG. 2F illustrates a timing diagram for writing (program) data "1", and FIG. 2G illustrates a timing diagram for writing (inhibit) data "0", according to the teachings of the present invention.

FIGS. 6A, 6B, 6C, 6D and 6E illustrate example memory cell layout for the one time programmable memory, and FIG. 6F illustrates block diagram for the memory cell array, according to the teachings of the present invention.

FIGS. 7A, 7B and 7C illustrate an example layout for the local sense amp, and FIG. 7D illustrates schematic for related local sense amp, according to the teachings of the present invention.

DETAILED DESCRIPTION OF PREFERRED EMBODIMENT(S)

Reference is made in detail to the preferred embodiments of the invention. While the invention is described in conjunction with the preferred embodiments, the invention is not intended to be limited by these preferred embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, as is obvious to one ordinarily skilled in the art, the invention may be practiced without these specific details. In other instances, well-known methods, procedures, components, and circuits have not been described in detail so that aspects of the invention will not be obscured.

Figure 1A:
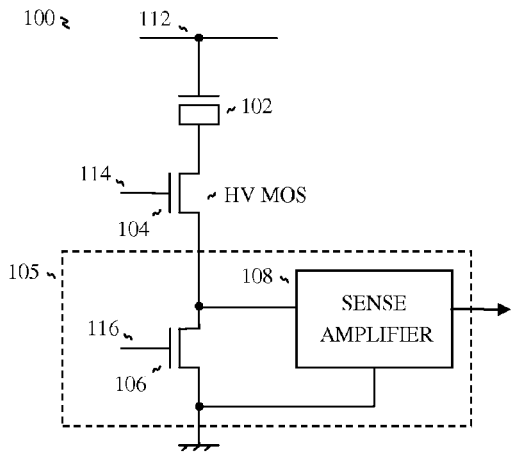
FIG. 1A depicts a prior art for one-time programmable memory including a capacitor and MOS transistor.
Figure 1B:
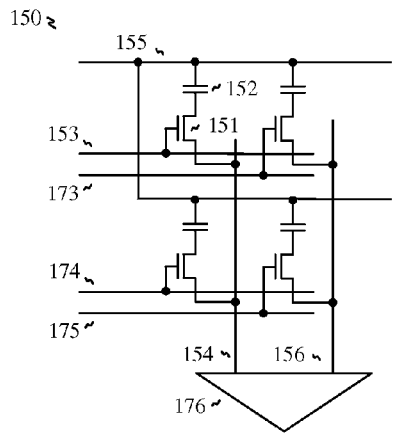
FIG. 1B illustrates another prior art.
Figure 2A:
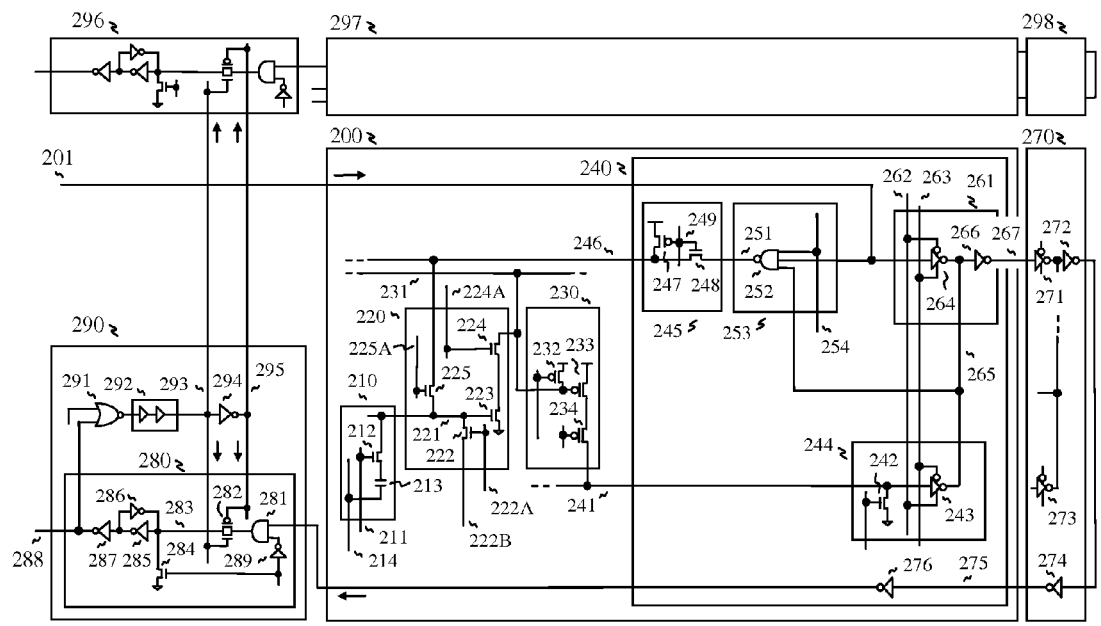
FIG. 2A illustrates a one time programmable memory with light bit line architecture.

The present invention is directed to OTP (one time programmable) read only memory as shown in FIG. 2A, wherein a memory block 200 comprises a memory cell 210, a local sense amp 220, a segment sense amp 230 and a global sense amp 240. The memory cell 210 includes a pass transistor 212 as an access device and a capacitor 213 as a one-time programmable storage element, and the memory cell 210 is connected to a word line 211 and a plate line 214, where the capacitor 213 is blown or not for storing a data. And the capacitor is composed of various structures, such as a MOS (Metal-Oxide Semiconductor) gate capacitor, a PIP (Polysilicon Insulator Polysilicon) capacitor and an MIM (Metal Insulator Metal) capacitor. And the memory cell 210 is connected to the local sense amp 220 through a local bit line 221 for reading data. The local sense amp 220 is connected to the segment sense amp 230 through a segment bit line 231, and an amplify circuit 244 of the global sense amp 240 is connected to the segment sense amp 230 through a global bit line 241. A write bit line 246 is connected to the local sense amp 220 for writing data, such that the capacitor is blown for storing data "1", otherwise the capacitor keeps un-blown state for storing data "0". More detailed memory cell structure will be illustrated as below.

The local sense amp 220 is composed of a reset transistor 222 for resetting the local bit line 221, a write (program) transistor 225 for writing data, a local amplify transistor 223 for reading the local bit line 221, and a local select transistor 224 for selecting and enabling the local amplify transistor 223.

The segment sense amp 230 includes a pre-set transistor 232 for pre-setting a segment bit line 231 which is connected to the local select transistor 224, a segment amplify transistor 233 for receiving an output from one of multiple local sense amps through the segment bit line 231, and a segment select transistor 234 connecting to the segment amplify transistor 233 for selecting and enabling the segment amplify transistor 233.

The global sense amp 240 includes a global amplify circuit 244 including a first tri-state inverter 243 as an amplify circuit for reading the global bit line 241 and a reset transistor 242 for resetting the global bit line 241 to low, and a data transfer circuit 261 including a second tri-state inverter 264 for bypassing an input from a forwarding write line 201 and the read inverter 266 for transferring a read output from the global amplify circuit 244 and an output from the second tri-state inverter 264 through a common node 265, and a returning buffer circuit 276 for buffering a returning read line 275. And also the global sense amp 240 includes a write circuit including a data receive circuit 253 for receiving write data from a forwarding write line 201 and a write transfer circuit 245 for driving the write bit line 246.

In order to realize fast random access, the local bit line 221 is shorter than that of conventional array architecture for reducing capacitive loading. For instance, the local bit line loading is ½, ¼ or ¹⁄₁₆ compared with the conventional bit line. However, by dividing the bit line into short lines, more sense amps are required. Thus, each sense amp should occupy a small area for inserting between the divided memory arrays, such that the local sense amp 220 includes four transistors, the segment sense amp 230 included three transistors, and the global sense amp 240 occupies around four transistors per column because it is shared by eight columns where the global sense amp is composed of 2 transistors per column for write transfer circuit 245 and 19 transistors per eight columns for configuring the data receive circuit 253, the global amplify circuit 244 and the data transfer circuit 261.

For reading and writing data, a buffered data path is connected to the global sense amp 240, such that the buffered data path includes forwarding write path and returning read path, which realize to reduce parasitic loading for each data line, because data line is divided into short line while unselected portion of the data line is not charging when writing. Furthermore, unselected portion of the data line is used as a read data line which is a forwarding read line 267. Thus, the forwarding read line 267 receives a read output from a memory cell through multi-stage sense amps. And the forwarding read line 267 is buffered and connected to data output node through multiple buffers and the returning read line 275. With the returning read path, access time is almost same regardless of selected memory cell location, which realizes to latch the read output at a time with enough set-up and hold time even though a latch clock is fixed. When writing, the forwarding write line 201 serves as a write path, such that a data receive circuit 253 is enabled by a write enable signal 254 for receiving a data input from the forwarding write line 201. More detailed read operation and write operation will be explained as below.

In order to reduce chip area, the local sense amp receives an output from one of multiple memory cells through the local bit line 221, the segment sense amp receives an output from one of multiple local sense amps through the segment bit line 231, and the global amplify circuit 244 of the global sense amp 240 receives an output from one of multiple segment sense amps through the global bit line 241. In doing so, the local sense amp 220 serves as a first sense amplifier configuring a first dynamic circuit which drives the segment bit line 231 as a capacitive load. And the segment sense amp 230 serves as a second sense amplifier configuring a second dynamic circuit which drives the global bit line 241 as a capacitive load, so that the first tri-state inverter 243 of in the global sense amp 240 serves as a third sense amplifier configuring a static inverter.

When reading data "1" (blown) from the memory cell 210, for example, the bit line 221 is raised to higher than VT (threshold) voltage of the local amplify transistor 223 by asserting the word line 211 while the plate line 214 keeps VDD (supply) voltage. And the bit line voltage is measured by the local sense amp 220, while the local select transistor 224 is enabled but the write transistor 225 disabled. Thus, the segment bit line 231 is quickly discharged to VSS (ground) voltage from VDD voltage while the pre-set transistor 232 is turned off. And then, a segment amplify transistor 233 of the segment sense amp 230 quickly charges the global bit line 241 when the segment select transistor 234 is turned on. As a result, the common node 265 is quickly changed to low by the first tri-state inverter 243 as the third sense amplifier while the reset transistor 242 is turned off. Then, the read inverter 266 receives the common node voltage 265, while the second tri-state inverter 264 is turned off for the selected memory block by asserting block select signals 262 (high) and 263 (low). In doing so, the read output is transferred to an output latch circuit 280 through the forwarding read line 267 and inverting buffers in unselected memory block 270, while unselected second tri-state inverter 271 is turned on for bypassing the read output but unselected first tri-state inverter 273 keeps turn-off state. As a result, the read output is reached to the output node 288 through inverting buffers 271, 273, 274 and 276, and the output latch circuit 280, wherein the inverting buffer 276 is repeated in the global sense amp for buffering, which configure a returning read path. And during standby, the write data 201 keeps low state for pre-setting the common node 265 to high state by turning on the second tri-state inverter 264.

In contrast, when reading data "0" (unblown), the local bit line 221 is not charged because the selected memory cell 210 does not charge the local bit line through unblown capacitor, thus the local bit line 221 is not changed. Alternatively, a dummy cell (not shown) is connected to the local bit line for compensating word line coupling when reading data "0", such that a dummy word line for the dummy cell is lowered for lowering the local bit line voltage very slightly, which eliminates coupling noise for the local bit line. Thereby the local amplify transistor 223 does not set up a strong current path to the segment bit line 231. Hence, the segment bit line keeps high. And the global bit line 241 keeps low. As a result, the common node 265 of the global sense amp is not changed, such that the common node 265 keeps the pre-charged state. In doing so, data "0" is not arrived to the output latch circuit, such that the voltage difference of the local bit line is converted to time difference with gain difference of the sense amps. Thus data "1" serves as a reference signal to reject latching data "0" to the output latch circuit for differentiating the fast data (high data) and the slow data (low data) in a time domain.

Particularly, in order to reduce turn-off current, the local amplify transistor 223 is composed of longer channel length transistor than that of the pre-set transistor 232 of the segment sense amp, the segment amplify transistor 233 is composed of longer channel length transistor than that of the pre-set transistor 242 of the global sense amp. Alternatively, the reset transistors 222, the pre-set transistor 232 and the reset transistor 242 are composed of low threshold MOS transistor, such that the low threshold transistors keep the pre-charge state strongly with sub-threshold leakage current when reading data "0", because the segment bit line 231 and the global bit line 241 keep floating state while the local amplify transistor 223 is turned when reading data "0". In addition, the local amplify transistor and the segment amplify transistor are composed of high threshold MOS transistor, for realizing low power operation as another alternative configuration, while the local amplify transistor and the segment amplify transistor are composed of equal channel length transistor to that of the pre-set transistor of the segment sense amp and the reset transistor of the global sense amp.

The local amplify transistor 223 is stronger than the memory cell, and the segment amplify transistor 233 is much stronger than the local amplify transistor 223 with wide channel. Furthermore, the sense amp need not reference bit line because the sense amp does not compare voltage or current with reference bit line, but the sense amp detects whether the local amplify transistor 223 is turned on or not by the selected memory cell through the local bit line.

Figure 5A:
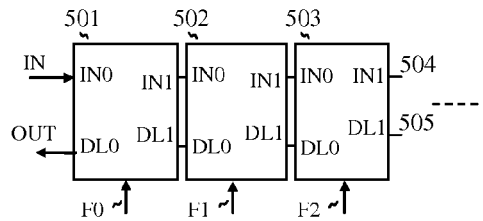
FIG. 5A illustrates a tunable delay circuit.

In the output latch circuit 280, the read output changes the latch node 283 and output 288 to high from low through inverters 285 and 287 when the read output of the inverter 276 is raised to high while the latch node 283 was reset to low by NMOS 284 and an AND gate 281 with inverter 289 before activated. After then, the read output is stored in the latch node 283 with cross coupled inverters 285 and 286. And the output 288 changes NOR gate 291 to low, so that a transmission gate 282 is locked by signal 293 and 295 which are transferred from the output 288 through a tunable delay circuit 292 (detailed circuit as shown in FIG. 5A) and inverter 294. Simultaneously, output latch circuits 290 and 296 are also locked by the signal 293 and 295, where main output latch circuit 296 is composed of same circuit as the output latch circuit 280. In doing so, the output 288 serves as a reference signal, which is generated by the reference memory cells, such as the memory cells 210 which stores data "1" (blown). Adding delay circuit 292, the reference signal serves as a locking signal, where the delay circuit is tunable for differentiating data "1" and data "0", more effectively. As a result, the sensing scheme including the locking signal is referred to as a "time-domain sensing scheme" with multi-stage sense amps.

Thus, the output latch circuit 280 and the tunable delay circuit 292 configure a latch control circuit 290, in order to generate the locking signal. More detailed delay circuit will be explained as below. And the NOR gate 291 is used to generate the reference signal even though one of reference cells is failed, where more than one reference column is added to the memory block even though the drawing illustrates only one reference memory column including the output latch circuit 280. In this manner, the read outputs from the main memory block 297 and 298 are stored to the output latch circuit 296 by the locking signals 293 and 295 when activated.

When writing data "1", the capacitor is blown such that the write transfer circuit 245 drives the write bit line 246 to low while the data receive circuit 253 receives high data from the forwarding write line 201. More specifically, the write transfer transistor 245 is composed of a pre-set transistor 247 for pre-setting the write bit line 246 and a transfer gate 248 for transferring the write data while the write select signal 249 is used for pre-setting or transferring write data. Before enabling the write transistor 225 and the transfer gate 248, an output 251 of the data receive circuit 253 is set up by a 3-input NAND gate 252 when a write enable signal 254 is enabled. And also the reset transistor 222 is turned off for releasing the local bit line 221. The word line 211 is asserted to a predetermined word line voltage and the plate line 214 is raised to a pre-determined plate line voltage. When the plate line 214 is raised to the pre-determined plate line voltage, for example, higher than supply voltage, the local bit line 221 is lowered to ground voltage by turning on the write transistor 225 and the transfer transistor 248, while the write bit line 246 set up ground voltage with the write transfer circuit 245 and the data receive circuit 253. As a result, the potential between the plate line 214 and the storage node of the capacitor is overstressed, which breaks down the oxide layer of the capacitor 213.

When writing (programming), the local sense amp 220 serves as a detector circuit which detects whether the capacitor is blown or not by the overstress voltage, because the local bit line 221 is raised by a current path at least higher than threshold voltage of MOS transistor, wherein the current path is set up from the plate line 214 of the capacitor to the local bit line 221. Thus the local sense amp 220 discharges the segment bit line 231, and the segment sense amp charges the global bit line 241 like a read operation. When the global bit line 241 is charged, the first tri-state inverter 243 changes the common node voltage 265 to low from high, thus the common node voltage is used as a feedback signal 265 for raising the write bit line 246, which cuts off the current path from the plate line 214. In this manner, the memory cells are uniformly programmed, which means that the programmed cell has equivalent resistive value. More specifically, applied voltage to the capacitor is more uniformed with feedback circuit because voltage drop of the plate line 214 is reduced during program. Without the current detector circuit, the current path is sustained within a pre-determined programming duration. The voltage drop of the plate line depends on data pattern sensitivity, such that all "1" programming sets up more current. In contrast, a minimum current path is set up when only one data is programmed in the conventional programming circuit without feedback circuit.

When writing data "0", the capacitor is not blown, such that the write bit line 246 is raised near supply voltage by the NAND gate 252 with low input of the forwarding write line 201, which does not break down the capacitor with understress voltage. Furthermore, a source line 222B of the reset transistor 222 is raised to VDD voltage for unselected local sense amp during write operation. More detailed operation will be explained as below for the decoding scheme.

Referring now to FIG. 2B in view of FIG. 2A, I-V curve of the local amplify transistor 223 is illustrated when reading. For reading the memory cell, the word line 211 is asserted to a predetermined voltage, after then the reset transistor 222 is turned off. Thus, the local bit line 221 is keeps V0 voltage (near VSS voltage) for reading data "0" because there is no current path through the capacitor which is not blown, where charges in the capacitor is negligibly less for raising the local bit line. Thereby the local amplify transistor 223 is in sub-threshold region (D0 in FIG. 2B), and the local amplify transistor 223 can only flow leakage current ID0 while the local select transistor 224 is turned on. On the contrary, when the memory cell 210 stores data "1" (D1 in FIG. 2B), the local bit line 221 is raised to V1 voltage where V1 voltage is near VDD voltage. Thereby the local amplify transistor 223 flows a current ID1 because there is a current path through the blown capacitor to the local bit line from the plate line 214 (at VDD voltage). Hence, the local amplify transistor 223 is in saturation region.

Referring now to FIG. 2C in view of FIG. 2A, discharge time of the segment bit line 231 is illustrated. When the capacitor of the selected memory cell stores data "1", the segment bit line 231 is discharged by the local amplify transistor 223 because the local bit line is raised near VDD voltage. On the contrary, the segment bit line 231 keeps pre-set state but very slowly discharged by leakage current, when reading data "0". For reducing the leakage current, longer channel transistor is used for the local amplify transistor. Similarly, the segment amplify transistor 233 is also composed of longer channel transistor for reducing the leakage current. Or higher threshold transistor can be used as the local amplify transistor and the segment amplify transistor, alternatively.

Referring now to FIG. 2D in view of FIG. 2A, detailed timing diagram for reading data "1" is illustrated. To read data, the selected source line 222B is lowered for resetting the local bit line while the reset transistor 322 is turned on. After then, the reset control (RC) signal 222A is asserted to low for releasing the local bit line 221, and then the word line 211 is raised to a predetermined voltage, while the plate line 214 sustains VDD voltage. Alternatively, the source line keeps low during read operation. And another alternative configuration is that the word line and the reset control (RC) signal 222A are slightly overlapped for discharging charges in the capacitor. Thereby, the local bit line (LBL) 221 is charged to VDD-VT voltage (near VDD voltage) from VSS voltage by the memory cell 210 when the capacitor is blown, which discharges the segment bit line (SBL) 231 when the local select (ST) signal 224A is asserted to high for selecting the local select transistor 224. Discharging the segment bit line 231, the global bit line 241 is changed to high by the segment sense amp 230. By changing the global bit line, the common node 265 connecting to the first tri-state inverter is changed to low, while the reset transistor 242 is turned off. By changing the common node 255 to low, the change is transferred to output node (DO) 288 through the returning read line 257 and inverting buffers 266, 271, 272, 274 and 276. After reading data, all the control signals including the reset control (RC) 222A, the word line, and other control signals, are returned to pre-charge state or standby mode. During read operation, the write (WT) enable signal 225A keeps low state for turning off the write transistor 225.

Referring now to FIG. 2E in view of FIG. 2A, detailed read timing diagram for reading data "0" is illustrated, wherein the local bit line (LBL) 221 is sustained near VSS voltage after the word line asserted, because un-blown capacitor does not pull up the local bit line, while the plate line (PL) 214 keeps VDD voltage during read operation. While the local bit line keeps VSS voltage, the local amplify transistor 223 is in sub-threshold region. Thereby, the segment bit line 231 keeps pre-set state. And the global bit line (GBL) keeps reset state, and the common node 265 also keeps pre-charge state. However, the local bit line (LBL) 221 is very slowly charged by leakage current from the unblown capacitor 213 and the write transistor 225. The segment bit line (SBL) 231 is very slowly discharged by the turn-off current through the local sense amp. And the global bit line (GBL) 241 is charged by the leakage, where the leakage current depends on transistor parameters, temperature and channel width. Hence, the read output 267 may be changed by the sense amps. In order to avoid the false flip with the leakage current, the locking signals 293 and 295 are generated to lock the output latch circuit 296 as a main memory column, in order to reject latching data "0" as a slow data. After reading data "0", all the control signals including the reset control (RC) signal 222A, the word line, and other control signals, are returned to pre-charge state or standby mode. Thus, the locking signal 293 and 295 based on fast data (data "1") effectively rejects latching slow data, such that the reference signal is generated by fast data (data "1") with delay time as shown T0, so that the timing margin T1 is defined to reject slow data (data "0").

In this manner, time-domain sensing scheme can differentiate the stored data in the capacitor within a predetermined time domain. Thereby, data "1" is quickly reached to the output latch circuit, which generates a locking signal, but data "0" is very slowly transferred, thus the locking signal effectively rejects data "0" to be latched to the output latch circuit. In other words, fast cycle memory (with no page mode) does not require the locking signal which is generated by the reference signal based on reference cells storing data "1", because data "0" is not reached to the output latch circuit within a short cycle. Thus, an enable signal from a control circuit is used to control the output latch circuit, which does not require reference cells and related circuits. And by applying multi-divided bit line architecture, fast read operation and write operation are realized.

Referring now to FIG. 2F in view of FIG. 2A, detailed timing diagram for writing (program) data "1" is illustrated. For programming data "1", the reset control signal 222A is de-asserted to low for releasing the local bit line, and then the word line 211 is asserted to a pre-determined voltage. Hence, the storage node of the capacitor 213 is charged to VDD-VT voltage through the NMOS pass transistor 212 and the write transistor 225 because the pre-set transistor 247 in the write transfer circuit 245 is turned on, which pre-sets the write bit line 246 to high. After then, the plate line 214 is asserted to a program voltage (VPP). After the plate line 214 is asserted, the pre-set transistor 247 in the write transfer circuit 245 is turned off, and simultaneously the write transfer gate 248 is turned on by the write select (WS) signal 249. By turning on the write transfer gate 248, the write bit line 246 is discharged to low by the data receive circuit 253, because the data receive circuit 253 receives all high input, such that the write data is asserted to high for writing data "1", the write enable signal 254 is asserted to high, and the common node 265 is pre-set at high.

By lowering the write bit line 246, the local bit line 221 is also lowered, so that the storage node of the capacitor is discharged to low. When the storage node is discharged, the insulation layer of the capacitor is overstressed because the plate line is already asserted to VPP voltage. As a result, the capacitor is broken down within a given time. After blown, a current path is set up from the plate line 214 to the local bit line 221. By the current path, the local bit line 221 is raised from VSS voltage to higher than VT voltage. When the local bit line is raised to VT voltage of the local amplify transistor 223, the segment bit line 231 is discharged by the local amplify transistor 223 while the local select transistor 224 is turned on to measure the local bit line voltage after blown. Thus, the common node 265 is changed to low through the global bit line and the first tri-state inverter 243 because the read path is the same as read operation as explained above, as long as the local bit line is raised to threshold voltage. In doing so, the current path is cut off by raising the write bit line with the common node voltage 265 as a feedback (FD) signal. In doing so, the multi-stage sense amps are used as a detector when programming for cutting off the current path after the capacitor is blown. And the feedback signal is used as a reference signal for measuring a break-down time of the capacitor.

Referring now to FIG. 2G in view of FIG. 2A, detailed timing diagram for writing data "0" is illustrated, wherein the capacitor 213 is not blown because the local bit line 221 is not discharged through the write bit line 231. Even though the write transfer gate 248 is turned on, the write bit line 246 is not discharged to VSS voltage by the data receive circuit 253 which keeps high with NAND gate 252 because the forwarding write line 201 keeps low. Hence, the insulation layer of the capacitor is under stress while the plate line 214 is raised to VPP voltage, which does not break down the capacitor.

Figure 3:
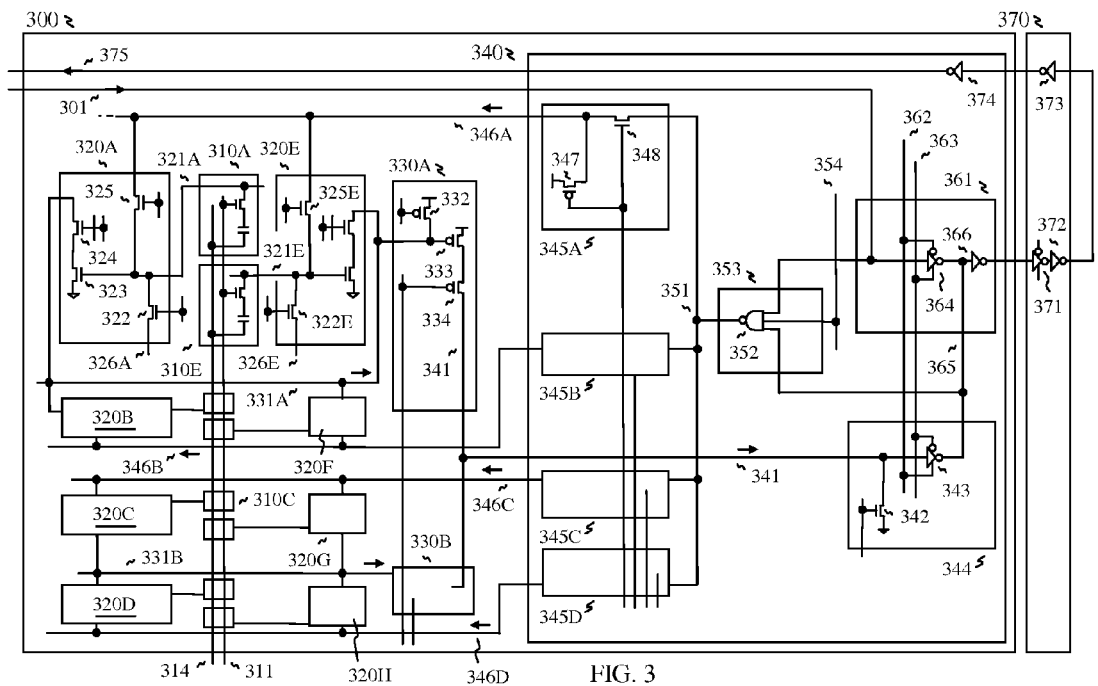
FIG. 3 illustrates a decoding scheme for the one time programmable memory, according to the teachings of the present invention.

In FIG. 3, a decoding scheme for the memory is illustrated, wherein a memory block 300A comprises left local sense amps 320A, 320B, 320C and 320D, right local sense amps 320E, 320F, 320G, and 320H, a global sense amp 340 including write transfer circuits 345A, 345B, 345C and 345D, data receive circuit 353, and read circuit 344, and data transfer circuit 361. The memory cell 310A is connected to the left local sense amp 320A, another memory cell 310E is connected to the right local sense amp 320E, and other (unnumbered) memory cells are connected to local sense amps, respectively. The memory cells are connected to a word line 311 and a plate line 314. And adjacent memory block 370A is composed of the same circuit as the memory block 300A.

The read path is established from one of memory cells to data output node 375 through one of local sense amps, one of segment sense amps, and the read circuit, such that the local sense amps 320A, 320B, 320E and 320F are connected to the segment sense amp 330A through a segment read line 331A, and the local sense amps 320C, 320D, 320G and 320H are connected to the segment sense amp 330B through a segment read line 331B, in order to reduce number of segment read lines.

For implementing one-of-eight column decoding, eight memory cells are activated by the word line 311, and each memory cell is connected to each local sense amp respectively. For example, the local amplify transistor 323 of the local sense amp 320A reads the memory cell 310A through the local bit line 321A when the local select transistor 324 is turned on, while the reset transistor 322 and the write transistor 325 are turned off. And for reducing coupling noise from adjacent bit line, unselected source line 326E keeps high for sustaining the unselected local bit line 321E near VDD voltage while the unselected reset transistor 322E is turned on, but selected source line 326A is lowered for sensing. Hence, unselected local bit line 321E keeps near VDD voltage, when reading the memory cell 310A through the selected local bit line 321A, so that coupling noise from adjacent bit line is minimized. By asserting the word line 311, an output from the memory cell 310A is transferred to the local sense amp 320A, the segment sense amp 330A reads the local sense amp 320A through the segment read line 331A, but local sense amps 320B, 320E and 320F are not selected, because the local select transistor 324 of the local sense amp 320B, 320E and 320F is turned off. Hence, two different select signals decode the left local sense amps for decoding the local select transistor 324, and two more select signals decode the right local sense amps (not shown). Similarly, the local sense amp 320C reads the memory cell 310C, and an output from the memory cell is transferred to the segment sense amp 330B through another segment read line 331B, when the local select transistor is turned on, but local sense amps 320D, 320G and 320H are not selected.

After then, one of two segment sense amps 330A and 330B is selected by segment select signal, such that the segment sense amp 330A is selected by a segment select transistor 334 and a current path is set up through the segment amplify transistor 333 when the pre-set transistor 332 is turned off. As a result, only one read output is transferred to the common node 365 through the first tri-state inverter 343 while the second tri-state inverter 364 in the selected memory block 300A is turned off, so that the common node 365 is pulled down by the first tri-state inverter, while the reset transistor 342 is turned off. And the read output is transferred to data output node 375 through the read inverter 366 and inverting buffers 371, 372, 373 and 374, while unselected second tri-state inverter 371 in the unselected memory block 370A is turned on, in order to bypass the read output.

For writing (programming) data, eight memory cells are turned on by asserting the word line 311 while the local bit lines are raised near VDD voltage through the write transistor 325, and the write bit lines 346A, 346B, 346C and 346D are pre-set by the pre-set transistor 347 in the write transfer circuits 345A, 345B, 345C and 345D. In doing so, the storage node of the capacitor is pre-set to VDD-VT voltage, which reduces voltage stress for unselected memory cells. Then, capacitor of the selected memory cell 310A, for example, is overstressed by lowering to VSS voltage through the selected local bit line 321A and the write bit line 346A while the write bit line is discharged to VSS voltage by output 351 of the NAND gate 352 of the data receive circuit 353 through the write transfer gate 348, but adjacent memory cell 310E is not overstressed by turning off the write transistor in the local sense amp 320E, because the forwarding write line 301 is asserted to high for program. On the contrary, the source line 326E is sustained to high for the unselected local sense amp, which pulls up the unselected local bit line in the right hand side when the reset transistor is turned on. But the selected local sense amp is activated by lowering the source line 326A in the left hand side for sensing the local bit line voltage.

And other unselected memory cells in the left hand side are not overstressed by keeping the write bit line to high with the pre-set transistor 347 while the write transistor 325 is turned on. For programming, the plate line 314 is raised to VPP voltage, as explained above. And then, the storage node of the capacitor of the selected memory cell 310A is discharged to VSS voltage by lowering the local bit line, so that the capacitor is overstressed and blown. After the capacitor is blown, the local bit line is raised, which turns on the local sense amp, the segment sense amp and the global sense amp. Thus the change is transferred to the common node 365 as a feedback signal for raising the write bit line with the NAND gate 352, which cuts off a current path from the plate line 314 to the local bit line. And the read output is also transferred to the output latch circuit (280 in FIG. 2A) for realizing time domain sensing scheme. In the drawing, the output latch circuit is not illustrated for simplifying.

For writing (program inhibit) data "0", the write data 301 is asserted to low, so that the output 351 of the NAND gate 352 is raised to high. Thereby the local bit line is not discharged, and also the capacitor is not blown with under stress.

Figure 4:
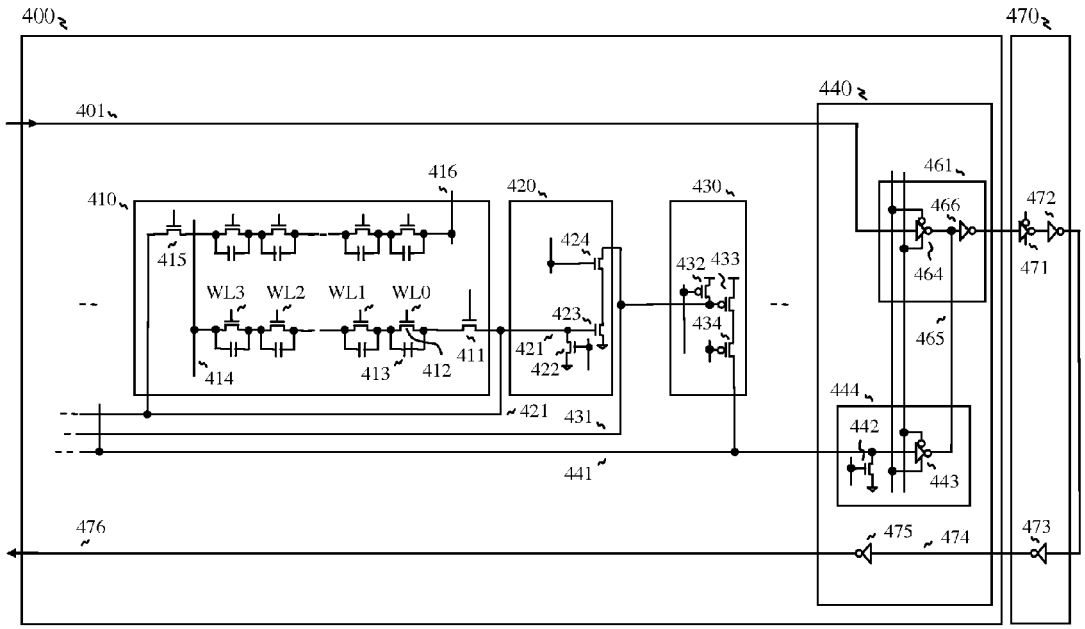
FIG. 4 illustrates an alternative circuit for configuring a mask ROM, according to the teachings of the present invention.

Furthermore, the sensing scheme is very useful for reading a mask ROM as another type of one time programmable memory with a contact mask change (or implant mask change). In FIG. 4, an alternative circuit for configuring a mask ROM is illustrated. The memory block 400 comprises memory strings 410, the local sense amp 420, the segment sense amp 430 and the global sense amp 440, wherein a first memory string includes a first string select transistor 411 and a first serial memory cell array, and a second memory string includes a second string select transistor 415 and a second serial memory cell array. The first serial memory cell is connected to a source line 414 and the second serial memory cell is connected to another source line 416. In particular, a capacitor 413 of the memory cell is connected to next memory cell in a series connection with a pass transistor 412, so that the memory cells configure a NAND string with the capacitors. In order to program the mask ROM memory cell, the capacitor is shorted by a contact layer, so that the contact layer should be changed for programming, where write circuit is not necessary for programming. More detailed memory cell structure is illustrated as below. For reading a memory cell, for example, the word line WL0 is de-asserted to low from high, thus the contact status is measured by the local sense amp and other read circuits, while the first string select transistor 411 is turned on and other word lines, WL2, WL3 and WL4 are turned on for bypassing. But unselected memory string is de-selected by keeping the second string select transistor 415 to low.

When reading data "1" (shorted), the word line WL0 is lowered to VSS voltage while other word lines keep VDD voltage, thus the local bit line 421 is raised near VDD voltage while the source line 414 keeps VDD voltage. And the bit line voltage is measured by the local sense amp 420, while the local select transistor 424 is enabled. Thus, the segment bit line 431 is quickly discharged to VSS (ground) voltage from VDD voltage (supply voltage) by the local sense amp 420 while the pre-set transistor 432 is turned off. And then, a segment amplify transistor 433 of the segment sense amp 430 quickly charges the global bit line 441 when the segment select transistor 434 is turned on. As a result, the common node 465 is quickly changed to low by the first tri-state inverter 443 while the reset transistor 442 is turned off. Then, the read inverter 466 receives the common node voltage 465, while the second tri-state inverter 464 is turned off for the selected memory block by asserting block select signals. In doing so, the read output is transferred to an output latch circuit and other read operation is same as that of FIG. 2A, such that the read output is reached to the output node 476 through inverting buffers 471, 473 and 475, and the returning read line 474.

In contrast, when reading data "0" (not shorted), the local bit line 421 is not charged because the selected memory cell 410 does not charge the local bit through floating capacitor, thus the local bit line 421 is not changed. Thereby the local amplify transistor 423 does not set up a strong current path to the segment bit line 431. Hence, the segment bit line keeps high. And the global bit line 441 keeps low. As a result, the common node 465 of the global sense amp is not changed, such that the common node 465 keeps the pre-charged state. In doing so, data "0" does not change data output of the output latch circuit, such that the voltage difference of the local bit line is converted to time difference with gain difference of the sense amps. Thus data "1" serves as a reference signal to reject latching data "0" to the output latch circuit for differentiating the fast data (high data) and the slow data (low data) in a time domain as explained above.

Figure 5B:
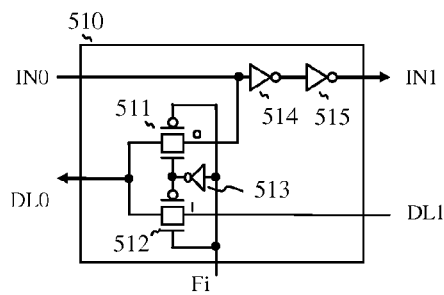
FIG. 5B illustrates a delay unit of the tunable delay circuit.

In FIG. 5A, more detailed a tunable delay circuit (as shown 292 in FIG. 2A) is illustrated, wherein multiple delay units 501, 502 and 503 are connected in series, the first delay unit 501 receives input IN and generates output OUT, the second delay unit 502 is connected to the first delay unit, and the third delay unit 503 is connected to the second delay unit 502 and generates outputs 504 and 505, and so on. Each delay unit receives a fuse signal, such that the first delay unit receives F0, the second delay unit receives F1, and the third delay unit receives F2. And more detailed delay unit is illustrated in FIG. 5B, wherein the delay unit 510 receives an input IN0 and a fuse signal Fi, thus the fuse signal Fi selects output from the input IN0 or input DL1, so that a transfer gate 511 is turned on when the fuse signal Fi is low and output of inverter 513 is high, otherwise another transfer gate 512 is turned on when the fuse signal Fi is high and output of inverter 513 is low to bypass DL1 signal. Inverter chain 514 and 515 delays IN0 signal for the next delay unit, where more inverter chains or capacitors can be added for the delay even though the drawing illustrates only two inverters.

Figure 5C:
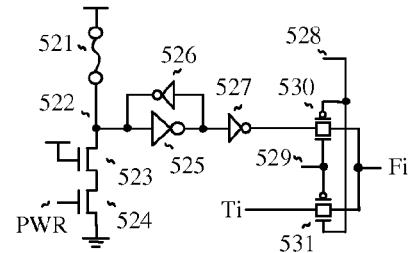
FIG. 5C illustrates a related fuse circuit of the tunable delay circuit, according to the teachings of the present invention.

In FIG. 5C, a related fuse circuit of the tunable delay circuit (as shown in FIG. 5A) is illustrated in order to store information for the delay circuit, so that a fuse serves as a nonvolatile memory, wherein a fuse 521 is connected to a latch node 522, a cross coupled latch including two inverters 525 and 526 are connected to the latch node 522, pull-down transistors 523 and 524 are serially connected to the latch node 522 for power-up reset. Transfer gate 530 is selected by a select signal 529 (high) and another select signal 528 (low) in order to bypass the latch node voltage 522 through inverter 525 and 527. In doing so, fuse data is transferred to output node Fi, otherwise test input Ti is transferred to Fi when a transmission gate 531 is turned on.

Methods of Fabrication

The memory cells can be formed from single crystal silicon on a wafer. Alternatively, the memory cells can be formed from thin-film polysilicon layer within the current CMOS process environment. Furthermore, the memory cells can be formed in between the routing layers. In this manner, fabricating the memory cells is independent of fabricating the peripheral circuits on the surface of the wafer. In order to form the memory cells in between the metal routing layers, LTPS (Low Temperature Polycrystalline Silicon) can be used, as published, U.S. Pat. No. 5,395,804, U.S. Pat. No. 6,852,577 and U.S. Pat. No. 6,951,793. The LTPS has been developed for the low temperature process (around 500 centigrade) on the glass in order to apply the display panel. Now the LTPS can be also used as a thin film polysilicon transistor for the memory device on the wafer. The thin film based transistor can drive multi-divided bit line which is lightly loaded, even though thin film polysilicon transistor can flow less current than single crystal silicon based transistor on the surface of the wafer, for example, around 10 times weaker than that of conventional transistor, as published, "Poly-Si Thin-Film Transistors An Efficient and Low-Cost Option for Digital Operation", IEEE Transactions on Electron Devices, Vol. 54, No. 11, November, 2007, and "A Novel Blocking Technology for Improving the Short-Channel Effects in Polycrystalline Silicon TFT Devices", IEEE Transactions on Electron Devices, Vol. 54, No. 12, December, 2007. During LTPS process, the MOS transistor in the control circuit and routing metal are not degraded. And the steps in the process flow should be compatible with the current CMOS manufacturing environment for forming memories, such as U.S. Pat. No. 6,700,151 and No. 6,184,089. In this respect, detailed manufacturing processes for forming the memory cell, such as width, length, thickness, temperature, forming method, or any other material related data, are not described in the present invention.

Figure 6B:
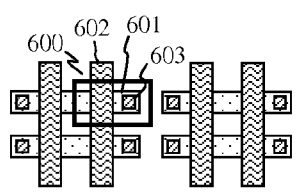
Figure 6B:
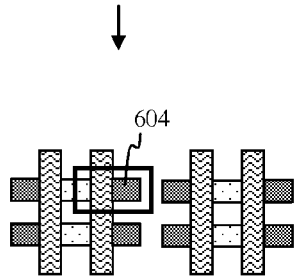
Figure 6C:
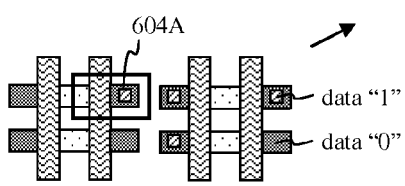
Figure 6D:
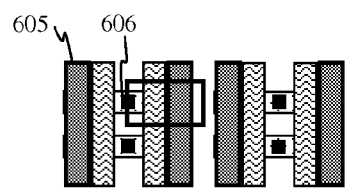

In FIGS. 6A, 6B, 6C and 6D, example layout for configuring a memory cell array is illustrated. A solid line 600 depicts a memory cell. In the process steps, active region 601 is formed first, and gate oxide is formed on the active region (not shown), then gate region 602 is formed on the gate oxide region. After then, contact region 603 is formed as shown in FIG. 6A, in order to connect the active region to the storage element. And FIG. 6B shows a conduction layer 604 which is used as a bottom plate of the capacitor. In FIG. 6C, an upper plate 605 of the capacitor as a one-time programmable storage element, where the gate region 602 is illustrated and a contact region 606 is defined for connecting metal region as below. And in FIG. 6D, a first metal layer 607 serving as the local bit line is formed on the contact region 606 (in FIG. 6C). And, a second metal layer 608 for global word line is formed on the first metal layer 607. In this open bit line structure, one word line is used to control the memory cell with no passing word line, which makes a straight word line in shape. Hence, open bit line structure occupies 6F.sup.2 in general, which minimizes chip area.

Figure 6E:
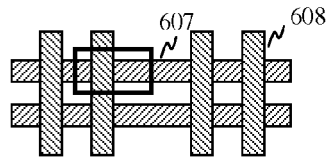

In FIG. 6E, detailed array configuration is illustrated, wherein a memory cell 610A is connected to the local bit line 621A which is also connected to the local sense amp 620A to read a data from the memory cell with the word line 611, and another memory cell 610B is connected to the local bit line 621B which is connected to the local sense amp 620B to read data with the same word line 611. When reading data, only one word line 611, for example, is asserted to a predetermined voltage. Thus, a voltage output from the memory cell 610A is transferred to the local sense amp 620A, but another output from the memory cell 620B is not selected, in order to share the segment bit line 631. The other local sense amps 620C and 620D are not activated. The output of the local sense amp 620A is transferred to a read circuit (not shown). And write operation is executed by the write bit line 646 when the write transistor (225 in FIG. 2A) is turned on in the local sense amp.

In FIG. 7A to 7C, an example layout for the local sense amp is illustrated, wherein the local sense amp 720 (220 in FIG. 2A) is placed next to memory cell (not shown). The local sense amp 720 includes poly gate 722 as the reset transistor, poly gate 723 as the local amplify transistor, poly gate 724 as the local select transistor, poly gate 725 as the write transistor. Particularly, the local amplify transistor 723 and the write transistor 725 includes relatively longer channel transistor for reducing turn-off current. And the transistors 722, 723, 724, and 725 are composed of n-type active region 702 on p-well region 701. And metal-1 region and via-1 region are defined as shown in FIG. 7B, such that metal-1 region for the local bit line 721 is connected to drain region of the reset transistor 722 and gate region of the local amplify transistor 723 in FIG. 7A. And metal-1 region 746 serves as the write bit line. And in FIG. 7C, metal-2 region is defined, such that VSS voltage is provided to the reset transistor. And the write bit line 746 and the segment bit line 731 are defined for connecting to the related transistor and also upper layers (not shown). The metal-2 region 722B is used for connecting the source line of the reset transistor 722, and the metal-2 region 7224A is used for decoding the local select transistor 724.

In FIG. 7D, related circuit including the local sense amp 720 is illustrated for the drawings FIG. 7A to 7C. The local sense amp 720 includes the write transfer transistors 725, the reset transistor 722 which is connected to the reset control signal 722A, the local amplify transistor 723 which is connected to the local bit line 721, and the local select transistor 724 which selects the local amplify transistor with control signal 724A. The memory cell 710A and 710B are connected to the word line 711 and the local sense amp 720 through the local bit line 721. And an output of the local sense amp 720 is connected to the write bit line 746 and the segment bit line 731, where the node numbers of the circuit as shown in FIG. 7D are the same as FIG. 7A to 7C for ease of understanding.

Figure 8:
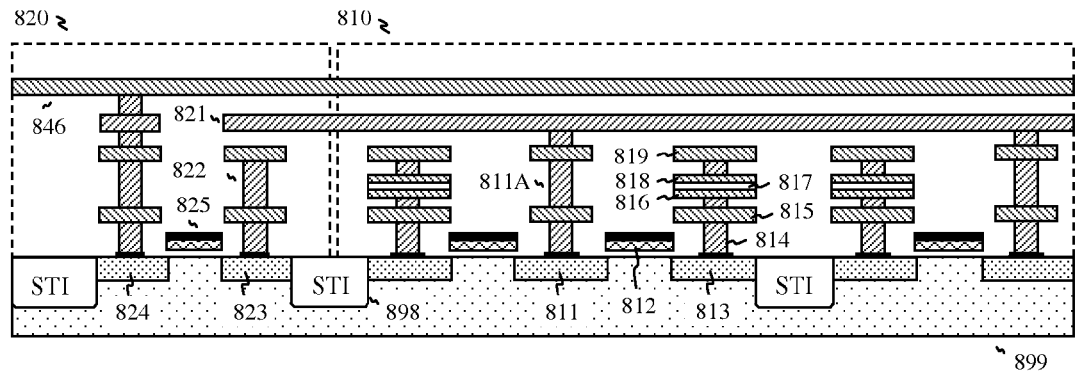
FIG. 8 illustrates an example memory cell structure for forming one time programmable memory, according to the teachings of the present invention.

In FIG. 8, an example cross sectional view for the one time programmable memory cell is illustrated, wherein memory cell region 810 includes memory cells, such that the capacitor is composed of bottom plate 816 and top plate 818 on insulation layer 817, the bottom plate 816 of the capacitor is connected to a drain/source 813 through metal-1 region 815 and contact region 814 of the pass transistor 812, and the top plate 818 is connected to the plate line 819 which supplies a high voltage for programming. And the local bit line 821 is connected to a drain/source 811A of the pass gate 812. Thus memory cell data in the storage node 813 is transferred to the local bit line 821, wherein the local bit line 821 is composed of metal-2 layer as an example. And the local bit line 821 is connected to the write transistor 825 through contact region 822 and a drain/source region 823 and 824, where the write transistor 825 is connected to the write bit line 846 through a drain/source region 824. Hence, the peripheral circuit region 820 is placed on the same surface of a substrate 899, where the memory cell region 810 is isolated by STI (Shallow Trench Isolation) region 898. Furthermore, the capacitor is composed of various structures, such as a PIP (Polysilicon Insulator Polysilicon) capacitor and an MIM (Metal Insulator Metal) capacitor. Alternatively, a MOS (Metal-Oxide Semiconductor) gate capacitor can be used as the storage capacitor (not shown).

Figure 9:
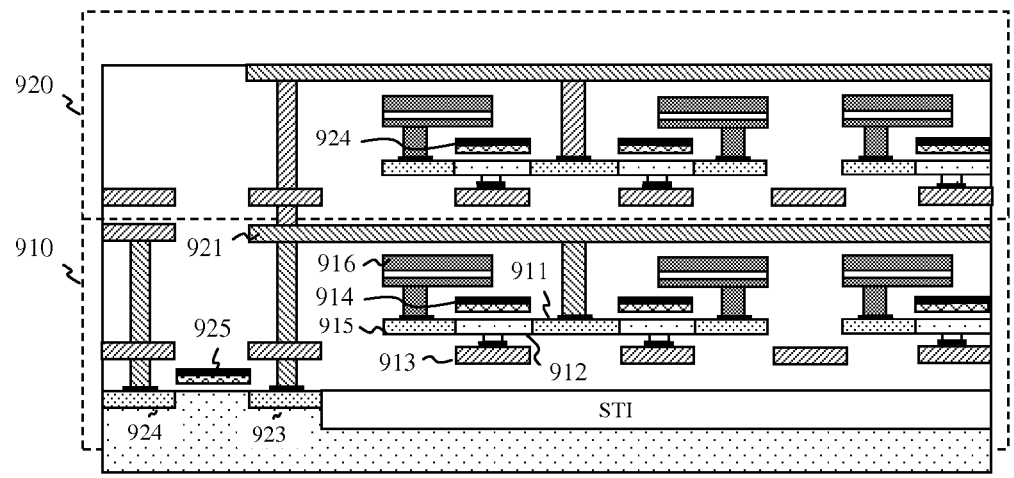
FIG. 9 illustrates alternative memory cell structure for stacking the memory cells, according to the teachings of the present invention.

In FIG. 9, a stacked memory cell structure is illustrated as an alternative configuration, wherein memory cells in the first floor 910 are composed of thin film transistor including thin film active layers 911 and 915 which are connected to a body region 912, and a metal bias line 913 is connected to the body region 912 through a contact region for biasing the thin film transistor, where the gate region 914 is formed on the body region 912. The active region 915 serves as a storage node which is connected to the capacitor including a plate line 916. Memory cells in a first floor 910 are connected to the local bit line 921 which is formed from metal-1 region. And memory cells in a second floor 920 are composed of thin film layer as well, such that the memory cell structure is the same as that of the first floor. And the memory cells are connected to the local bit line 921. The write transistor 925 is formed on a substrate with active region 923 and 924. The first floor memory cell is controlled by a first floor word line 914 and the second floor memory cell is controlled by a second floor word line 924. As shown in the figure, the memory cells include thin film transistor as a pass transistor with body-tied structure for biasing the body, for example, VSS voltage is provided in order to reduce sub-threshold leakage current for NMOS pass transistor. And the body biasing is useful for alleviating self-heating problem of short channel thin film transistor. Furthermore, thin film layer is formed from single crystal silicon, poly crystalline silicon, silicon-germanium and germanium. And, the memory cells in the first floor and the second floor have same characteristics as long as same material and thickness are used.

Figure 10A:
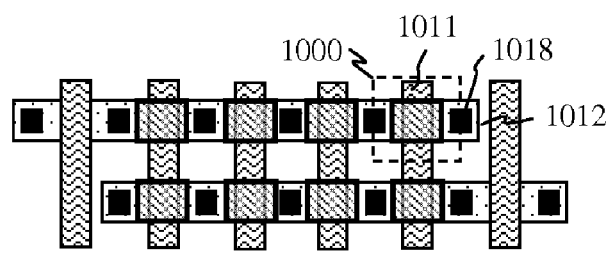
FIG. 10A illustrates an example memory cell structure for configuring a mask ROM.

Furthermore, the multi-stage sense amps are also useful to read a mask ROM as another type of one time programmable memory using a contact mask change. In FIG. 10A, an example memory cell structure for configuring a mask ROM is illustrated, wherein a solid line 1000 depicts a memory cell including a pass transistor and a capacitor formed on the pass transistor. And a memory string is composed of a series memory cell array. In the process steps, active region 1012 is formed first, and gate oxide is formed on the active region 1012, then gate region 1011 is formed on the gate oxide region. After then, contact region 1018 is formed, in order to connect the active region to the storage element.

Figure 10B:
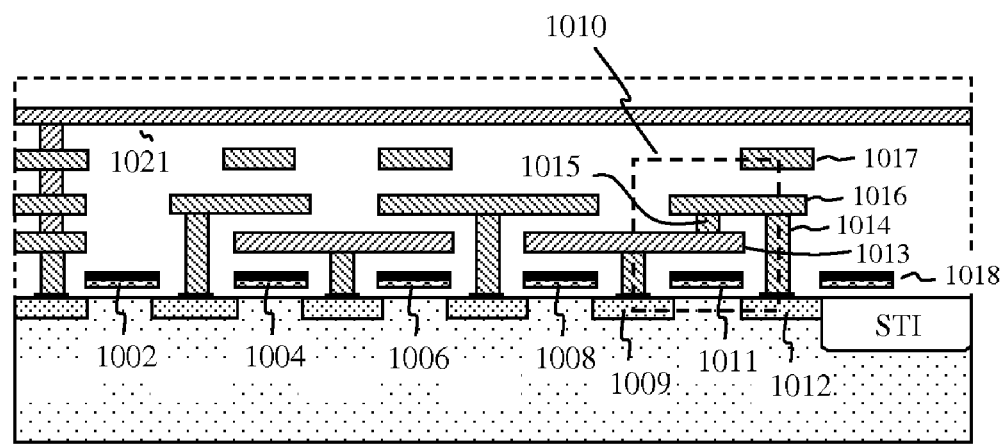
FIGS. 10B and 10C illustrate the related memory cell structures for configuring the mask ROM, according to the teachings of the present invention.

In FIG. 10B, the related memory cell structure for configuring the mask ROM is illustrated, wherein the memory cell 1010 is composed of a pass transistor including a gate region 1011, a drain region 1009 and a source region 1012. The capacitor is composed of a first plate 1013 and a second plate 1016 connecting to the source region 1012 through a contact region 1014. For programming the memory cell, a contact region 1015 is formed by a contact mask during fabrication, which realizes the mask ROM. Thus, the programmed cell is a shorted circuit for storing data "1", while un-programmed cell is an open circuit for storing data "0", and other unselected memory cells in a series memory string are bypassed by turning on the unselected pass transistors 1004, 1006 and 1008 while the string select transistor 1002 is turned on for selecting the memory string. And the source line 1018 is connected to ground voltage. The memory cells are connected to the local bit line 1021 which is composed of metal-4 layer, while metal-1 layer is used as the first plate, metal-2 layer is used as the second plate, and metal-3 layer 1017 is used as global word line.

Figure 10C:
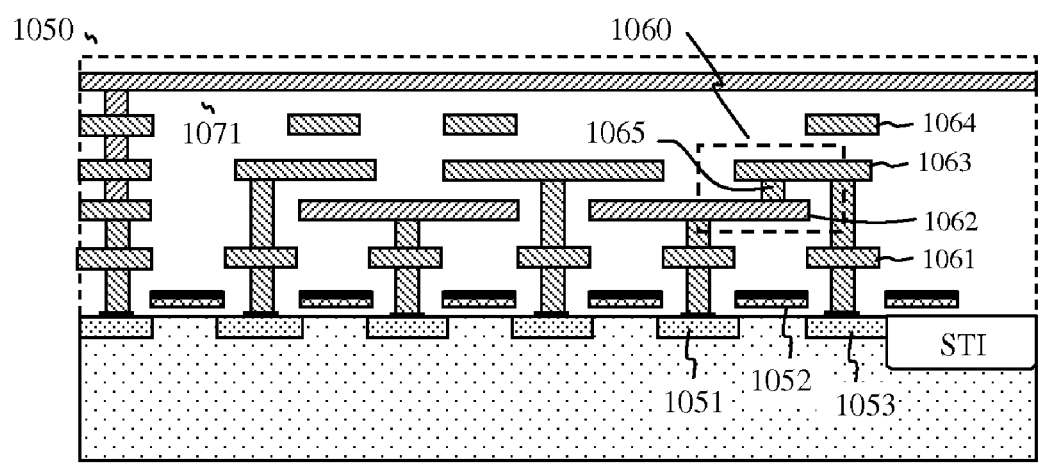

In FIG. 10C, an alternative memory cell structure for configuring the mask ROM is illustrated, wherein the capacitor portion 1060 of the memory cell in a memory string 1050 is formed on the first metal layer 1061. Hence, the programming is executed by a contact region 1065 between the metal-2 layer 1062 and the metal-3 layer 1063, which reduces a turn around time, even though more routing layers are used for configuring the mask ROM. And the other structures are the same as that of FIG. 10B, such that the pass transistor is composed of the gate region 1052, the drain region 1051 and a source region 1053.

While the descriptions here have been given for configuring the memory circuit and structure, alternative embodiments would work equally well with reverse connection such that PMOS transistor can be used as a pass transistor for configuring the memory cell, and signal polarities are also reversed to control the reverse configuration.

The foregoing descriptions of specific embodiments of the invention have been presented for purposes of illustration and description. They are not intended to be exhaustive or to limit the invention to the precise forms disclosed. Obviously, many modifications and variations are possible in light of the above teaching. The embodiments were chosen and described in order to explain the principles and the application of the invention, thereby enabling others skilled in the art to utilize the invention in its various embodiments and modifications according to the particular purpose contemplated. The scope of the invention is intended to be defined by the claims appended hereto and their equivalents.

What is claimed is:

1. A memory device, comprising:
a memory cell including a pass transistor and a one-time programmable storage element, wherein the one-time programmable storage element is composed of a capacitor which is shorted or open for storing a data; and
a first dynamic circuit serving as a local sense amp connecting to the memory cell through a local bit line, wherein the first dynamic circuit includes a reset transistor for resetting the local bit line, a local amplify transistor for reading the local bit line, where the local amplify transistor is serially connected to a local select transistor, a write transistor for connecting the local bit line to a write bit line; and
a second dynamic circuit serving as a segment sense amp connecting to the local select transistor through a segment bit line, wherein the second dynamic circuit is composed of a pre-set transistor for pre-setting the segment bit line, a segment amplify transistor for reading the segment bit line where the segment amplify transistor is serially connected to a segment select transistor connecting to a global bit line; and
a first tri-state inverter serving as a global amplify circuit of a global sense amp connecting to the global bit line, wherein the global sense amp includes a read circuit, a data transfer circuit, a returning buffer and a write circuit; and the read circuit includes the first tri-state inverter for reading the global bit line and a reset transistor for resetting the global bit line; and the data transfer circuit includes a second tri-state inverter for bypassing a write data and a read inverter for reading a common node which is connected to the first tri-state inverter and the second tri-state inverter; and the write circuit includes a data receive circuit for receiving the write data and a write transfer circuit for transferring an output of the data receive circuit to the write bit line; and the returning buffer includes an inverting buffer for buffering a returning read path connecting to the read inverter; and
an output latch circuit receiving and storing an output from the returning buffer; and
a latch control circuit generating a locking signal which is generated by a reference signal based on at least a reference memory cell, in order to lock the output latch circuit.

2. The memory device of claim 1, wherein the local amplify transistor and the segment amplify transistor are composed of longer channel length transistor than that of the pre-set transistor of the segment sense amp and the reset transistor of the global sense amp.

3. The memory device of claim 1, wherein the reset transistor of the local sense amp, the pre-set transistor of the segment sense amp and the reset transistor of the global sense amp are composed of low threshold transistor.

4. The memory device of claim 1, wherein the local amplify transistor and the segment amplify transistor are composed of high threshold MOS transistor, for realizing low power operation.

5. The memory device of claim 1, wherein the write circuit includes the data receive circuit and the write transfer circuit such that the data receive circuit is composed of a NAND gate and the write transfer circuit is composed of a pre-set transistor and a transfer gate; the NAND gate receives the write data, a write enable signal and a feedback signal, and the transfer gate transfers an output of the NAND gate to the write bit line.

6. The memory device of claim 1, wherein the latch control circuit includes a tunable delay circuit, such that the tunable delay circuit receives at least the reference signal which is generated by the reference memory cell; and the tunable delay circuit generates the locking signal by delaying the reference signal; and tuning information for the tunable delay circuit is stored in a nonvolatile memory.

7. The memory device of claim 1, wherein the latch control circuit includes a tunable delay circuit, such that the tunable delay circuit receives multiple reference signals which are generated by multiple reference memory cells; and the tunable delay circuit generates the locking signal by delaying at least one reference signal from the multiple reference signals; and tuning information for the tunable delay circuit is stored in a nonvolatile memory.

8. The memory device of claim 1, wherein the global sense amp is connected to a buffered data path, wherein the buffered data path is composed of a forwarding write line connecting to the data receive circuit and the second tri-state inverter, a forwarding read line connecting to the read inverter, and a returning read line connecting to the returning buffer.

9. The memory device of claim 1, wherein the memory cell is formed from single crystal silicon or polycrystalline silicon.

10. The memory device of claim 1, wherein the memory cell is formed from silicon-germanium or germanium.

11. The memory device of claim 1, wherein the memory cell includes n-channel MOS field effect transistor as an access device.

12. The memory device of claim 1, wherein the memory cell includes p-channel MOS field effect transistor as an access device.

13. The memory device of claim 1, wherein the memory cell is formed from a thin film transistor and a body of the thin film transistor is connected to a bias voltage.

14. The memory device of claim 1, wherein the memory cell is formed on peripheral circuits.

15. The memory device of claim 1, wherein the memory cell is stacked over another memory cell.

16. The memory device of claim 1, wherein the one-time programmable storage element of the memory cell is composed of the capacitor; and the capacitor includes a first plate connecting to the pass transistor and a second plate connecting a plate line; and an insulation layer is formed between the first plate and the second plate.

17. The memory device of claim 1, wherein the capacitor of the one-time programmable storage element is composed of various structures, such as a MOS (Metal-Oxide Semiconductor) gate capacitor, a PIP (Polysilicon Insulator Polysilicon) capacitor and an MIM (Metal Insulator Metal) capacitor.

18. The memory device of claim 1, wherein the capacitor of the one-time programmable storage element is composed of a first plate connecting to the pass transistor and a second plate connecting a plate line; and the first plate is contacted to the second plate after blowing an insulation layer between the first plate and the second plate, for configuring an OTP (One Time Programmable) memory.

19. The memory device of claim 1, wherein the capacitor of the one-time programmable storage element is composed of a first plate connecting to the pass transistor and a second plate connecting a plate line; and the first plate and the second plate are formed in between metal routing layers.

20. The memory device of claim 1, wherein the local bit line is connected to at least a memory string for configuring a mask ROM (Read Only Memory), such that the memory string includes a memory cell array configuring a series connection, a string select transistor connecting to the memory cell array; and each memory cell of the memory cell array is composed of the pass transistor and the one-time programmable storage element which is formed on the pass transistor; more specifically the one-time programmable storage element is composed of a first plate and a second plate, where the first plate is connected to a drain region of the pass transistor and the second plate is connected to a source region of the pass transistor; the first plate and the second plate are contacted by a contact region when programmed so that the write circuit of the global sense amp is not used.

* * * * *